(12) United States Patent
Tsukigata et al.

(10) Patent No.: US 9,181,615 B2
(45) Date of Patent: Nov. 10, 2015

(54) COATING FLUID FOR BORON DIFFUSION

(71) Applicant: SHIN-ETSU CHEMICAL CO., LTD., Tokyo (JP)

(72) Inventors: Shintarou Tsukigata, Annaka (JP); Toshifumi Matsuoka, Annaka (JP); Takenori Watabe, Annaka (JP); Hiroyuki Otsuka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 393 days.

(21) Appl. No.: 13/633,356

(22) Filed: Oct. 2, 2012

(65) Prior Publication Data
US 2013/0081691 A1    Apr. 4, 2013

(30) Foreign Application Priority Data
Oct. 4, 2011    (JP) .................. 2011-220051

(51) Int. Cl.
*H01L 31/042* (2014.01)
*C23C 10/00* (2006.01)
*C23C 10/18* (2006.01)
*C23C 10/60* (2006.01)
*C23C 28/04* (2006.01)
*C23C 10/20* (2006.01)
*H01L 21/22* (2006.01)
*H01L 31/068* (2012.01)
*H01L 31/18* (2006.01)

(52) U.S. Cl.
CPC ............ *C23C 10/00* (2013.01); *C23C 10/18* (2013.01); *C23C 10/20* (2013.01); *C23C 10/60* (2013.01); *C23C 28/042* (2013.01); *C23C 28/048* (2013.01); *H01L 21/2225* (2013.01); *H01L 31/068* (2013.01); *H01L 31/1804* (2013.01); *Y02E 10/547* (2013.01)

(58) Field of Classification Search
CPC ........ H01L 31/00–31/208; Y02E 10/50–10/60
USPC .................................................. 136/243–265
See application file for complete search history.

(56) References Cited

U.S. PATENT DOCUMENTS

| 6,049,035 A * | 4/2000 | Tsuri et al. ..................... 136/246 |
| 2003/0134469 A1* | 7/2003 | Horzel et al. .................. 438/249 |
| 2011/0114151 A1 | 5/2011 | Zaks et al. |
| 2012/0227786 A1* | 9/2012 | Hayashi et al. ................ 136/244 |

FOREIGN PATENT DOCUMENTS

| JP | 62-027529 B2 | 6/1987 |
| JP | 2010-056465 A | 3/2010 |
| JP | 2010-062223 A * | 3/2010 |

(Continued)

OTHER PUBLICATIONS

Patent Examination Report of Australian Patent Application No. 2012233002, dated Nov. 22, 2013, (7 pages).

(Continued)

*Primary Examiner* — Bach Dinh
(74) *Attorney, Agent, or Firm* — Westerman, Hattori, Daniels & Adrian, LLP (57) ABSTRACT

A coating fluid comprising a boron compound, an organic binder, a silicon compound, an alumina precursor, and water and/or an organic solvent is used to diffuse boron into a silicon substrate to form a p-type diffusion layer. The coating fluid is spin coated onto the substrate to form a uniform coating having a sufficient amount of impurity whereupon a p-type diffusion layer having in-plane uniformity is formed.

3 Claims, 2 Drawing Sheets

(56) References Cited

FOREIGN PATENT DOCUMENTS

| | | | |
|---|---|---|---|
| JP | 2010-205965 A | | 9/2010 |
| JP | 2011-035252 A | | 2/2011 |
| JP | WO2011046176 | * | 4/2011 |

OTHER PUBLICATIONS

Extended European Search Report dated Oct. 28, 2014, issued in corresponding European Patent Application No. 12187177.6 (8 pages).

* cited by examiner

COATING FLUID FOR BORON DIFFUSION

CROSS-REFERENCE TO RELATED APPLICATION

This non-provisional application claims priority under 35 U.S.C. §119(a) on Patent Application No. 2011-220051 filed in Japan on Oct. 4, 2011, the entire contents of which are hereby incorporated by reference.

TECHNICAL FIELD

This invention relates to a boron diffusion coating fluid which is applied to a semiconductor substrate when it is desired to form a diffusion layer in the substrate; a method of fabricating a semiconductor device, typically solar cell; and a semiconductor device, typically solar cell.

BACKGROUND ART

For the current manufacture of industrial or commercial solar cells, the most important task is a reduction of the manufacture cost. In general, the method of manufacturing solar cells through the following steps is widely used.

First, an n-type silicon substrate is provided. A single crystal silicon ingot is prepared by Czochralski (CZ) method, or a polycrystalline silicon ingot prepared by the cast method. The ingot is sliced by the multi-wire saw method, obtaining an n-type silicon substrate. The substrate is then immersed in alkaline solution for removing any damages on the substrate surface caused by slicing. Both the front (light-receiving) and back surfaces of the substrate are provided with a micro-texture structure having a maximum height of the order of 10 μm. Subsequently, dopants are thermally diffused into the substrate by a variety of methods to form p- and n-type diffusion layers. Further, $TiO_2$ or SiN is deposited on the light-receiving surface to a thickness of about 70 nm, for example, to form a passivation film having antireflection ability. Next, a silver-based paste is printed on both the surfaces and fired to form electrodes. The electrode on the light-receiving surface is of comb-shape having a width of about 100 to 200 for example.

Although this method consists of only the necessary minimum number of steps to construct the device, it is regarded superior because of the concomitant effects of enhancing solar cell performance such as energy conversion efficiency. For example, the thermal diffusion of dopant in forming a diffusion layer in a substrate functions to improve the diffusion length of minority carriers in bulk due to the gettering effect. Moreover, the antireflection film not only has the optical effect or reflectivity reducing effect, but also functions to reduce the recombination rate of carriers generated in proximity to the silicon surface. By virtue of the necessary minimum number of steps and several useful effects, industrial or commercial solar cells are now manufactured at lower cost than before.

Meanwhile, the means for forming the diffusion layer includes gas phase diffusion and coating/diffusion. The gas phase diffusion method generally uses $POCl_3$ as the n-type impurity source and $BBr_3$ as the p-type impurity source.

For the coating/diffusion method, spin coating and screen printing are typically employed. Spin coating is performed by dropping a coating fluid containing p- or n-type impurity source to the substrate surface, and spinning the substrate at a high speed, whereby a coating having a uniform thickness can be formed on the substrate surface. The substrate is then heat treated to form a p- or n-type diffusion layer. In the case of screen printing, a p- or n-type diffusion layer can be similarly formed.

In order for the coating/diffusion method to form a diffusion layer having a uniform impurity concentration, not only the coating fluid containing impurity source must be homogeneous, but also the coating fluid must be coated on the semiconductor substrate to a uniform composition and a sufficient thickness. One known coating fluid for impurity diffusion is the coating source described in JP-B S62-027529, for example.

CITATION LIST

Patent Document 1: JP-B S62-027529

DISCLOSURE OF INVENTION

The coating source described in Patent Document 1, however, has the problem that when the coating source is used to form a p-type diffusion layer in a silicon substrate having a texture structure, the layer becomes thin on peaks of the texture, resulting in a non-uniform boron diffusion concentration. Since the substrate outer circumferential region experiences a higher rotational speed during spin coating than the substrate center region, the coating becomes thinner in the substrate outer circumferential region. The resultant shortage of the impurity source leads to an increase of sheet resistance.

An object of the invention is to provide a coating fluid for boron diffusion which can form a uniform p-type diffusion layer in a substrate; a method of fabricating a semiconductor device, typically solar cell, using the coating fluid; and a semiconductor device, typically solar cell, fabricated thereby.

The inventors have found that a coating fluid having a modified composition can form a coating having a sufficient impurity content and a sufficient thickness on a substrate surface through spin coating step; and the addition of silica and alumina precursor allows for uniform boron diffusion.

The invention provides a boron diffusion coating fluid, a method of fabricating a semiconductor device, and a semiconductor device, as defined below.

[1] A coating fluid used to diffuse boron into a silicon substrate to form a p-type diffusion layer, comprising at least a boron compound, an organic binder, a silicon compound, an alumina precursor, and water and/or an organic solvent.

[2] The coating fluid of [1] wherein the boron compound is present in an amount of up to 4% by weight of the coating fluid.

[3] The coating fluid of [1] or [2] wherein the organic binder is polyvinyl alcohol and present in an amount of up to 4% by weight of the coating fluid.

[4] The coating fluid of [1] to [3] wherein the silicon compound is silica and present in an amount of up to 5% by weight of the coating fluid.

[5] The coating fluid of [1] to [4] wherein the alumina precursor is a compound capable of forming alumina upon heat treatment and present in an amount of up to 8% by weight of the coating fluid.

[6] The coating fluid of [1] to [5], having a viscosity of 80 to 140 mPa·s at 25° C.

[7] A method of fabricating a semiconductor device using the coating fluid of any one of [1] to [6].

[8] The method of [7] wherein the semiconductor device is a solar cell.

[9] The method of [8], comprising the steps of providing a n-type silicon substrate with a texture, applying the coating fluid of any one of [1] to [6] to one surface of the silicon substrate, causing a p-type diffusion layer to form, forming a n-type diffusion layer on the other surface of the silicon substrate, forming an antireflective coating on each of the diffusion layers, and forming electrodes.

[10] A semiconductor device which is fabricated by the method of [7].

[11] A solar cell which is fabricated by the method of [8] or [9].

Since the boron diffusion coating fluid is formulated so as to contain an organic binder and silica and to be amenable to a spin coating step, a coating having a sufficient impurity content can be uniformly formed on a substrate surface by spin coating step. Even when the substrate used has a texture, typically a pattern of pyramids on its surface as often found in the solar cell fabrication process, a p-type diffusion layer having in-plane uniformity can be formed.

Since the alumina precursor is uniformly dispersed in the coating formed from the coating fluid, a dense alumina layer is formed during heat treatment, which layer inhibits outward diffusion of boron dopant and enhances retention thereof. This facilitates to form a p-type diffusion layer having in-plane uniformity.

Due to the foregoing advantages, a p-type diffusion layer having uniformity can be formed over the substrate surface, which has been covered with the coating fluid. This leads to improved electrical properties of a semiconductor device, typically solar cell.

Particularly when a p-type diffusion coating fluid containing up to 4% by weight of a boron compound is coated onto a substrate and heat treated, a sufficient impurity source is provided on the substrate surface and dispersion of the boron compound is maintained.

In the preferred embodiment wherein the organic binder is polyvinyl alcohol, the retention and dispersion in solvent of the boron compound are improved. This also facilitates to form a p-type diffusion layer having in-plane uniformity.

The preferred silicon compound is silica. Silica which can be uniformly dispersed in the coating fluid is preferred. Silica may be modified with organic functionality. A mixture of silica fractions with different particle size is also acceptable. The addition of silica increases the viscosity of the coating fluid, increases the thickness of a coating formed on the substrate by spin coating, and provides for a sufficient amount of boron compound.

In a preferred embodiment, the alumina precursor is a compound capable of forming alumina upon heat treatment. The addition of the alumina precursor ensures that a dense alumina film is formed during heat treatment, which film inhibits outward diffusion of boron and enhances retention thereof. This facilitates to form a p-type diffusion layer having in-plane uniformity.

ADVANTAGEOUS EFFECTS OF INVENTION

The boron diffusion coating fluid ensures that a coating having a sufficient impurity content is formed on the substrate after spin coating. The silica and alumina-containing film inhibits outward diffusion of boron and enhances retention thereof. Thus a p-type diffusion layer having in-plane uniformity can be formed.

DESCRIPTION OF PREFERRED EMBODIMENTS

Embodiments of the invention are described below, but the invention is not limited thereto.

One embodiment is a coating fluid for boron diffusion. The boron diffusion coating fluid is applied to a semiconductor substrate by spin coating, for example, in order to form a p-type diffusion layer in the substrate. The boron diffusion coating fluid is defined as comprising at least a boron compound, an organic binder, a silicon compound, an alumina precursor, and water and/or an organic solvent.

Now that the boron diffusion coating fluid is formulated to the above composition, a uniform p-type diffusion layer can be formed. Over the region where a p-type diffusion layer is to be formed, the desired p-type diffusion layer can be formed via single coating. This leads to improvements in productivity and yield as well as cost savings.

The coating fluid contains an organic binder and a silicon compound, typically silica. Since the viscosity of the coating fluid varies over a wide range depending on the amounts of these ingredients, a coating fluid having rheological properties (viscosity, thixotropy) compatible with a particular coating method may be prepared.

In the embodiment, the p-type impurity source is a boron compound. By coating a p-type diffusion layer-forming coating fluid containing a boron compound onto a substrate and heat treating the coating, a p-type diffusion layer can be formed in the substrate surface.

Examples of the boron compound include boric acid, boric anhydride, alkyl borates, boric acid melamine, and ammonium borate. Commercially available boron compounds such as Hiboron® by Boron International Co., Ltd. are also useful. The boron compound is not limited to these. It may be a mixture of boron compounds in any ratio. Any compound may be used as long as it contains boron. Since commercial products can be used, the boron compound is readily available at low cost.

Desirably the boron compound is present in an amount of less than or equal to 4% by weight based on the total weight of the coating fluid. If the content of the boron compound exceeds 4 wt %, the boron compound may precipitate in the coating fluid, resulting in uneven dispersion. Alternatively, the boron compound may locally precipitate on the substrate surface after coating, resulting in formation of a non-uniform p-type diffusion layer. Although the lower limit content of the boron compound is not critical, the content of the boron compound is preferably more than or equal to 0.5% by weight.

Examples of the organic binder include polyvinyl alcohol (PVA), polyvinyl acetal, and polyvinyl acetate. Of these, PVA is preferred. PVA is effective for holding the boron compound and allows the boron compound to be uniformly dispersed in the coating fluid.

Desirably the organic binder is present in an amount of less than or equal to 4% by weight based on the total weight of the coating fluid. If the content of the organic binder exceeds 4 wt %, the coating fluid may have a high viscosity and so the necessary coating weight per substrate may be increased. In addition, the coating may become so thick in the substrate center region that organic residues may be left after in-plane thermal diffusion, detracting from solar cell performance. Although the lower limit content of the organic binder is not critical, the content of the organic binder is preferably more than or equal to 0.5% by weight.

The organic binder, typically PVA desirably has a degree of polymerization of up to 1,000, more desirably up to 800. If the degree of polymerization exceeds 1,000, the organic binder tends to agglomerate, detracting from dispersion of the coating fluid and failing to form a uniform p-type diffusion layer. Although the lower limit of degree of polymerization is not critical, a degree of polymerization of at least 100 is preferred for ease of handling. It is noted that the degree of polymerization corresponds to a number average molecular weight as measured by gel permeation chromatography (GPC) versus polystyrene standards.

Typical of the silicon compound is silica including hydrophilic silica, hydrophobic silica and spherical silica. Preference is given to silica which can be uniformly dispersed in the coating fluid. A mixture of silica fractions with different particle size is also acceptable. The addition of silicon compound increases the viscosity of the coating fluid, increases the thickness of a coating formed on the substrate by spin coating, and retains a sufficient amount of boron compound. That is, the silicon compound provides for a sufficient amount of p-type impurity on the substrate surface and enables to form a uniform p-type diffusion layer.

When silica is used, it may be either dry silica or wet silica. Use may also be made of silica which has been hydrophobized by surface treatment with silanes or silicones for enhancing compatibility with and adhesion to the boron compound and organic binder. Any silica such as fumed silica having a BET specific surface area of 50 to 400 $m^2/g$ and surface treated to be hydrophobic or silica produced by the sol/gel method may be used depending on the desired dispersion of the coating fluid.

Examples of silica include wet silica such as precipitated silica, and dry silica such as silica xerogel and fumed silica, which are commercially available. These silica species may be used as such since they are hydrophilic. Alternatively, silica may be hydrophobized by surface treatment with a compound having an organic silyl group, prior to use. Typical of silica are Aerosil® from Nippon Aerosil Co., Ltd., Nipsil® and Nipgel® from Tosoh Silica Co., Ltd., and Sylysia® from Fuji Silysia Chemical Co., Ltd. Silica should preferably have a BET specific surface area of 50 to 400 $m^2/g$, more preferably 50 to 200 $m^2/g$.

Desirably the silicon compound is present in an amount of less than or equal to 5% by weight based on the total weight of the coating fluid. If the content of the silicon compound exceeds 5 wt %, the coating fluid may have too low fluidity to coat, and such an increased amount indicates an increased cost. Although the lower limit content of the silicon compound is not critical, the content of the silicon compound is preferably more than or equal to 0.5% by weight.

In a preferred embodiment, the alumina precursor is a compound capable of forming alumina upon heat treatment. The addition of the alumina precursor ensures that a dense alumina film is formed during heat treatment, which film inhibits outward diffusion of boron and enhances retention thereof. This facilitates to form a uniform p-type diffusion layer.

Examples of the alumina precursor include aluminum hydroxide, aluminum chloride, and aluminum chloride hexahydrate. Desirably the alumina precursor is present in an amount of less than or equal to 8% by weight based on the total weight of the coating fluid. If the content of the alumina precursor exceeds 8 wt %, boron glass containing alumna formed by heat treatment may become difficult to be etched with hydrofluoric acid in the subsequent glass etching step and tend to leave surface residues. Although the lower limit content of the alumina precursor is not critical, the content of the alumina precursor is preferably more than or equal to 0.5% by weight.

Besides the above ingredients, a solvent is used in the coating fluid. The solvent is used for uniformly dispersing the boron compound, organic binder, silicon compound and alumina precursor and selected from deionized water and organic solvents alone or in admixture of two or more.

Examples include liquid paraffin, aliphatic hydrocarbon solvents, carbitol solvents, cellosolve solvents, higher fatty acid ester solvents, polyhydric alcohol solvents, higher alcohol solvents, higher fatty acid solvents, and aromatic hydrocarbon solvents. Inter alia, liquid paraffin and aliphatic hydrocarbon solvents are preferred because of less odor.

Suitable aliphatic hydrocarbon solvents include IP Solvent from Idemitsu Kosan Co., Ltd., Shellsol® D40, Shellsol® D70, Shellsol® 70, and Shellsol® 71 from Shell Chemical, Isopar G, Isopar H, Isopar L, Isopar M, Exxol D40, Exxol D80, Exxol D100, Exxol D130 (b.p. 279-316° C.), Exxol D140 (b.p. 280-320° C.), and Exxol DCS10/140 from Exxon.

Suitable carbitol solvents include methylcarbitol, ethylcarbitol, and butylcarbitol. Suitable cellosolve solvents include ethyl cellosolve, isoamyl cellosolve and hexyl cellosolve. Suitable higher fatty acid ester solvents include dioctyl phthalate, isobutyl dibutylsuccinate, isobutyl adipate, dibutyl sebacate, and di(2-ethylhexyl)sebacate. Suitable polyhydric alcohol solvents include ethylene glycol and glycerol. Suitable higher alcohol solvents include methylhexanol, oleyl alcohol, trimethylhexanol, trimethylbutanol, tetramethylnonanol, 2-pentylnonanol, 2-nonylnonanol, and 2-hexyldecanol. Suitable higher fatty acid solvents include caprylic acid, 2-ethylhexanoic acid, and oleic acid. Suitable aromatic hydrocarbon solvents include butylbenzene, diethylbenzene, dipentylbenzene, and diisopropylnaphthalene.

These organic solvents may be used alone while a mixture of two or more organic solvents may be used for adjusting the viscosity, and modifying the dispersion of the silicon compound and organic binder and the wetting of a textured silicon crystal substrate. In the boron diffusion coating fluid, a solvent compatible with the organic binder is preferably used in combination. The solvent is preferably used in an amount of 77 to 93% by weight based on the total weight of the coating fluid.

The coating fluid should preferably have a viscosity of 80 to 140 mPa·s at 25° C., more preferably 90 to 120 mPa·s at 25° C., as measured by a rotational viscometer. The rotational viscometer used herein is Brookfield DV-II+pro viscometer with spindle #5 at 25° C. and 20 rpm.

Desirably the coating of the coating fluid applied to the silicon substrate has a dry thickness of at least 5 μm, more desirably at least 10 μm. A thickness in this range provides a sufficient amount of p-type impurity and ensures that a p-type diffusion layer having uniformity and a high concentration is formed. Although the upper limit of the coating thickness is not critical, the thickness is preferably up to 25 μm, more preferably up to 20 μm for ease of handling.

Figure 1:
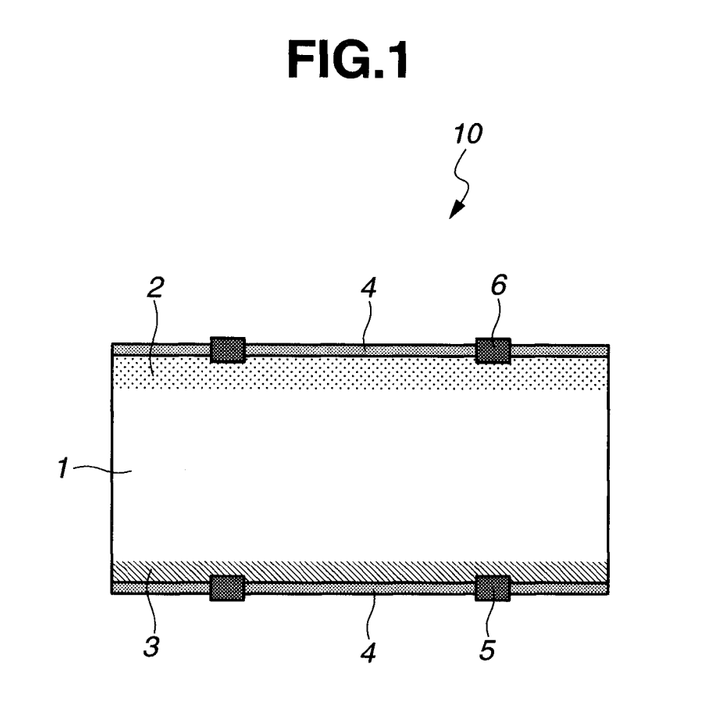
FIG. 1 is a schematic cross-sectional view of a solar cell fabricated by the invention.
Figure 2:
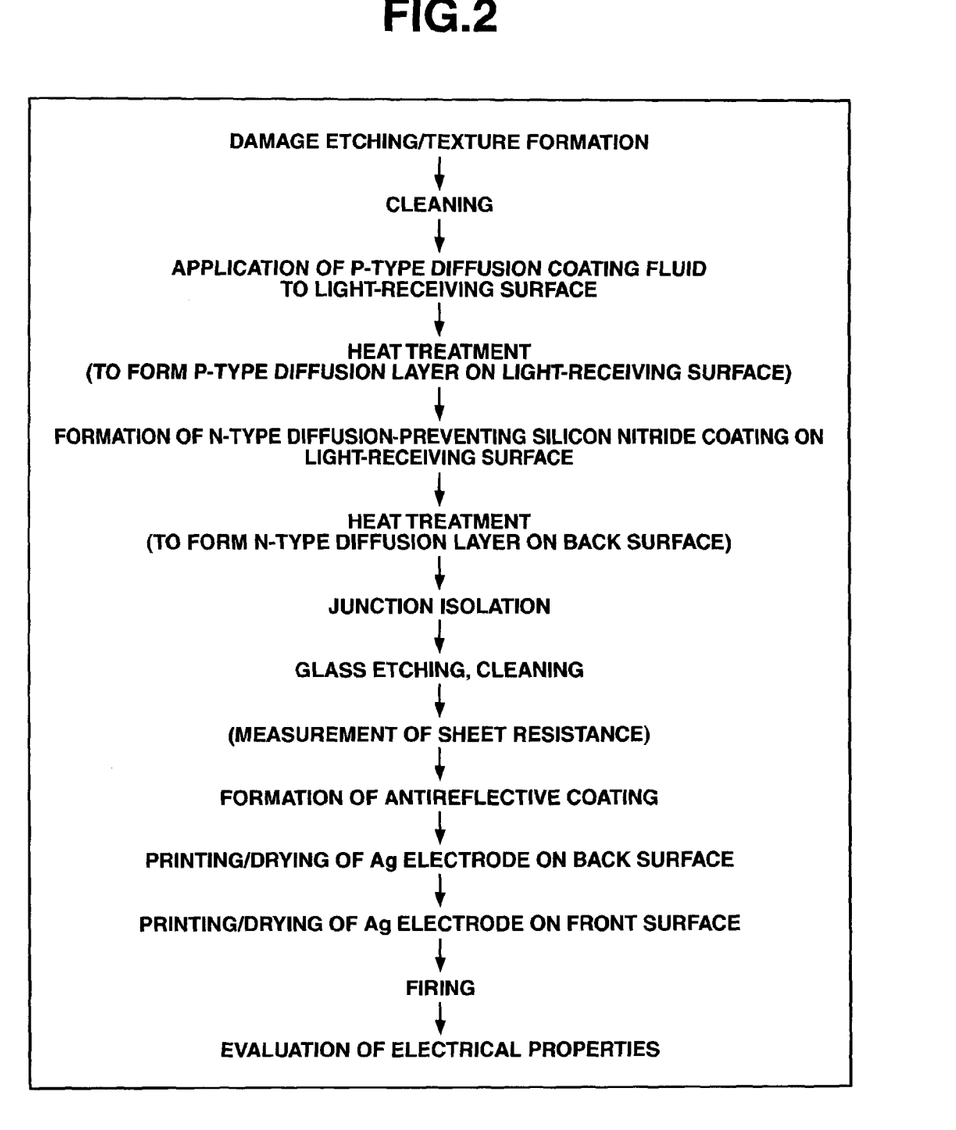
FIG. 2 is a flow chart illustrating a method of fabricating a solar cell using the boron diffusion coating fluid of the invention.

Next, the method of fabricating a semiconductor device, typically solar cell, using the boron diffusion coating fluid defined herein is described by referring to the embodiments shown in FIGS. 1 and 2. FIG. 1 schematically illustrates in cross-section a solar cell fabricated by the invention. FIG. 2 is a flow chart illustrating a method of fabricating a solar cell using the boron diffusion coating fluid of the invention.

First, a phosphorus-doped n-type single crystal silicon substrate 1 is provided as shown in FIG. 1. The single crystal silicon substrate is obtained by slicing a silicon ingot which may have been prepared by either Czochralski (CZ) method or the floating zone (FZ) method. It is preferred for the manufacture of solar cells with better performance that the substrate have a resistivity of 0.1 to 20 Ω·cm, more preferably 0.5 to 2.0 Ω·cm.

The substrate 1 is then immersed in a sodium hydroxide aqueous solution where a damaged layer is etched away. For damage removal from the substrate, other strong alkali aqueous solutions such as potassium hydroxide may be used. The same purpose may also be achieved with acid aqueous solutions such as fluoronitric acid.

After the etching for damage removal, the substrate 1 is provided with a random texture. Most often the solar cell substrate is preferably provided with an irregular or textured surface. This is because at least two reflections must occur on the light-receiving surface in order to reduce the reflectivity in the visible spectrum. While the texture shape consists of peaks and valleys, each peak may have a size of about 5 to 10 µm. Typical surface texture structures are V and U trenches, which may be formed by a grinding tool. The random texture structure may also be prepared by wet etching (involving immersing in an aqueous solution of sodium hydroxide with isopropyl alcohol added), acid etching, or reactive ion etching (RIE). It is noted that the texture structures formed on opposite surfaces are not depicted in FIG. 1 because they are of microscopic size.

Once the substrate is cleaned, the boron diffusion coating fluid is applied to the substrate surface by any suitable coating technique, typically spin coating. Two coated substrates are combined as a set with the coated surfaces mated together. Such sets of substrates are arranged on a quartz jig having spaced apart channels whereupon heat treatment is carried out to form a p-type diffusion layer 2.

The heat treatment converts the coating into a boron glass layer containing alumina and silicon compound (silica) on the surface, which is etched away with hydrofluoric acid, followed by RCA cleaning. It is preferred from the standpoints of diffusion time and cost of diffusion step that the p-type diffusion layer have an average sheet resistance of 35 to 50 ohm/square, more preferably 40 to 46 ohm/square. The CV value (serving as an index of variation), which is the standard variation of sheet resistance divided by the average sheet resistance, is preferably up to 10%, more preferably up to 5% because better solar cell performance is expectable.

Next, on the surface where the p-type diffusion layer has been formed, a silicon nitride coating of 80 to 300 nm thick for providing a barrier to n-type impurity is deposited by means of a direct plasma CVD system. Two SiN-coated substrates are combined as a set with the coated surfaces mated together. Such sets of substrates are arranged on a quartz jig having spaced apart channels whereupon heat treatment is carried out in $POCl_3$ atmosphere to form a n-type diffusion layer 3 in the surface opposite to the p-type diffusion layer-bearing surface.

Then junction isolation is carried out in a plasma etching chamber using $CF_4$ etching gas. In this junction isolation, samples are stacked so as to prevent the plasma and radicals from invading the light-receiving surface and back surface, and the edge is ground several microns in the stacked state.

Thereafter, the CVD film (silicon nitride film) and phosphorus glass formed on the surface are etched away with hydrofluoric acid, followed by RCA cleaning. Using a direct plasma CVD system, a silicon nitride film (or antireflective coating) 4 is deposited on the emitter layer as a surface protective layer. Preferably the silicon nitride film 4 has a thickness of 70 to 200 nm since it also serves as the ARC. The ARC may be replaced by another ARC such as oxide, titanium dioxide, zinc oxide or tin oxide coating. Besides the direct plasma CVD, other formation techniques such as remote plasma CVD, coating, and vacuum evaporation may also be used. From the economical aspect, the direct plasma CVD technique is preferred for the formation of a nitride film.

If a film capable of minimizing the total reflectivity, for example, a magnesium difluoride film having a refractive index of 1 to 2 is formed on the ARC, then the reflectivity is further reduced so that the generated current density may be increased. For the same purpose, a silicon oxide film may be stacked on the silicone substrate and the silicon nitride film.

On the back surface, a silver-based paste is applied and dried using a screen printing machine. On the front surface, a comb-shaped silver electrode is printed and dried using a screen printing machine. Thereafter, firing is carried out according to the predetermined thermal profile, forming a back electrode 5 and a front electrode 6. Besides the printing technique, the electrode formation may also be carried out by other techniques such as vacuum evaporation and sputtering.

Thus a solar cell 10 as shown in FIG. 1 is fabricated in a simple way.

Since the above-described method of fabricating a solar cell involves applying the boron diffusion coating fluid on the substrate, a coating having a sufficient thickness for boron diffusion can be formed. Although the coating fluid is applied by spin coating in the illustrated embodiment, other application techniques such as screen printing may also be used.

Now that the alumina precursor capable of forming a dense alumina film upon heat treatment is added to the coating fluid, the alumina film prevents outward diffusion of boron and enhances retention thereof. As a result, a p-type diffusion layer having in-plane uniformity may be formed.

EXAMPLE

Examples, Comparative Examples and Reference Examples are given below by way of illustration and not by way of limitation.

Example 1

A boron diffusion coating fluid was prepared by blending the following ingredients in a standard procedure.

Preparation of Coating Fluid for p-Type Diffusion

| Boron compound | boric acid: | 2 g |
|---|---|---|
| Organic binder | polyvinyl alcohol (degree of polymerization 500): | 2 g |
| Silicon compound | hydrophilic silica (BET surface area 200 m$^2$/g): | 2 g |
| Alumina precursor | aluminum chloride hexahydrate: | 4 g |
| Organic solvent | ethylene glycol: | 56 g |
| Solvent | water: | 34 g |
| Total | | 100 g |

The coating fluid thus prepared had a viscosity of 107 mPa·s at 25° C.

Example 2

A coating fluid was prepared as in Example 1 except that the boric acid content was 4 wt % and the ethylene glycol content was 54 wt %. The coating fluid had a viscosity of 112 mPa·s at 25° C.

Reference Example 1

A coating fluid was prepared as in Example 1 except that the boric acid content was 5 wt % and the ethylene glycol content was 53 wt %. The coating fluid had a viscosity of 113 mPa·s at 25° C.

Example 3

A coating fluid was prepared as in Example 1 except that the PVA content was 4 wt % and the ethylene glycol content was 54 wt %. The coating fluid had a viscosity of 133 mPa·s at 25° C.

Reference Example 2

A coating fluid was prepared as in Example 1 except that the PVA content was 5 wt % and the ethylene glycol content was 53 wt %. The coating fluid had a viscosity of 155 mPa·s at 25° C.

Comparative Example 1

A coating fluid was prepared as in Example 1 except that the PVA content was 0 wt % and the ethylene glycol content was 58 wt %. The coating fluid had a viscosity of 59 mPa·s at 25° C.

Example 4

A coating fluid was prepared as in Example 1 except that the silica content was 5 wt % and the ethylene glycol content was 53 wt %. The coating fluid had a viscosity of 129 mPa·s at 25° C.

Reference Example 3

A coating fluid was prepared as in Example 1 except that the silica content was 6 wt % and the ethylene glycol content was 52 wt %. The coating fluid had a viscosity of 141 mPa·s at 25° C.

Comparative Example 2

A coating fluid was prepared as in Example 1 except that the silica content was 0 wt % and the ethylene glycol content was 58 wt %. The coating fluid had a viscosity of 77 mPa·s at 25° C.

Example 5

A boron diffusion coating fluid was prepared as in Example 1 except that the aluminum chloride hexahydrate content was 8 wt % and the ethylene glycol content was 52 wt %. The coating fluid had a viscosity of 109 mPa·s at 25° C.

Reference Example 4

A coating fluid was prepared as in Example 1 except that the aluminum chloride hexahydrate content was 10 wt % and the ethylene glycol content was 50 wt %. The coating fluid had a viscosity of 104 mPa·s at 25° C.

Comparative Example 3

A coating fluid was prepared as in Example 1 except that the aluminum chloride hexahydrate content was 0 wt % and the ethylene glycol content was 60 wt %. The coating fluid had a viscosity of 109 mPa·s at 25° C.

Fabrication of Solar Cell

Solar cells were fabricated by the above-described method using the boron diffusion coating fluids of Examples 1 to 5, Comparative Examples 1 to 3, and Reference Examples of 1 to 4.

First, a phosphorus-doped n-type single crystal silicon substrate 1 of 15 cm squares by 200 μm thick having crystallographic orientation (100) and an as-sliced resistivity of 2 Ω·cm was provided as shown in FIG. 1. The substrate was immersed in a 40 wt % sodium hydroxide aqueous solution where the damaged layer was etched away. The substrate was then immersed in a 3 wt % sodium hydroxide aqueous solution with isopropyl alcohol added, where a random texture was formed by wet etching.

The substrate was then cleaned. The boron diffusion coating fluid was applied to the substrate surface by spin coating and dried at 120° C. for 1 minute (coating thickness 10 μm). Two coated substrates were combined as a set with the coated surfaces mated together. Such sets of substrates were arranged on a quartz jig having spaced apart channels and placed in an oven where the substrates were heated at 950° C. for 40 minutes to form a p-type diffusion layer 2.

A boron glass layer containing alumina and silica formed on the surface was etched away with hydrofluoric acid, followed by RCA cleaning.

Next, on the surface where the p-type diffusion layer had been formed, a silicon nitride coating of 200 nm thick as a barrier to n-type impurity was deposited by means of a direct plasma CVD system. Two SiN-coated substrates were combined as a set with the coated surfaces mated together. Such sets of substrates were arranged on a quartz jig having spaced apart channels and heat treated in $POCl_3$ atmosphere to form a n-type diffusion layer 3 in the surface opposite to the p-type diffusion layer-bearing surface.

Then, samples were stacked so as to prevent the plasma and radicals from invading the light-receiving surface and back surface. The stack was placed in a plasma etching chamber using $CF_4$ etching gas, where the edge was etched for junction isolation.

Thereafter, the CVD film and phosphorus glass formed on the surface were etched away with hydrofluoric acid, followed by RCA cleaning. Using a direct plasma CVD system, a silicon nitride film (or antireflective coating) 4 of 100 nm thick was deposited on the emitter layer as a surface protective layer.

Using a screen printing machine, a silver-based paste was applied and dried on the back surface. Using a screen printing machine and a comb-shaped electrode pattern printing plate, a silver electrode having a width of 80 μm was printed and dried on the front surface. Thereafter, firing was carried out according to the predetermined thermal profile, forming a back electrode 5 and a comb-shaped front electrode 6.

The current and voltage properties (Voc, Jsc, FF, Efficiency) of the thus fabricated solar cell of 15.6 cm squares were measured in an atmosphere of 25° C. using a solar simulator (light intensity 1 $kW/m^2$, spectrum AM1.5G).

The contents (wt %) of ingredients in the boron diffusion coating fluids of Examples and Comparative Examples are shown in Tables 1 to 4.

TABLE 1

|  | Example | | Reference Example |
|---|---|---|---|
| Ingredients (wt %) | 1 | 2 | 1 |
| Boric acid | 2 | 4 | 5 |
| PVA | 2 | 2 | 2 |
| Hydrophilic silica | 2 | 2 | 2 |
| Aluminum chloride hexahydrate | 4 | 4 | 4 |
| Ethylene glycol | 56 | 54 | 53 |
| Water | 34 | 34 | 34 |
| Total | 100 | 100 | 100 |

TABLE 2

|  | Comparative Example | Example | | Reference Example |
|---|---|---|---|---|
| Ingredients (wt %) | 1 | 1 | 3 | 2 |
| Boric acid | 2 | 2 | 2 | 2 |
| PVA | 0 | 2 | 4 | 5 |
| Hydrophilic silica | 2 | 2 | 2 | 2 |
| Aluminum chloride hexahydrate | 4 | 4 | 4 | 4 |
| Ethylene glycol | 58 | 56 | 54 | 53 |
| Water | 34 | 34 | 34 | 34 |
| Total | 100 | 100 | 100 | 100 |

TABLE 3

|  | Comparative Example | Example | | Reference Example |
|---|---|---|---|---|
| Ingredients (wt %) | 2 | 1 | 4 | 3 |
| Boric acid | 2 | 2 | 2 | 2 |
| PVA | 2 | 2 | 2 | 2 |
| Hydrophilic silica | 0 | 2 | 5 | 6 |
| Aluminum chloride hexahydrate | 4 | 4 | 4 | 4 |
| Ethylene glycol | 58 | 56 | 53 | 52 |
| Water | 34 | 34 | 34 | 34 |
| Total | 100 | 100 | 100 | 100 |

TABLE 4

|  | Comparative Example | Example | | Reference Example |
|---|---|---|---|---|
| Ingredients (wt %) | 3 | 1 | 5 | 4 |
| Boric acid | 2 | 2 | 2 | 2 |
| PVA | 2 | 2 | 2 | 2 |
| Hydrophilic silica | 2 | 2 | 2 | 2 |
| Aluminum chloride hexahydrate | 0 | 4 | 8 | 10 |
| Ethylene glycol | 60 | 56 | 52 | 50 |
| Water | 34 | 34 | 34 | 34 |
| Total | 100 | 100 | 100 | 100 |

The viscosity of the coating fluids of Examples, Comparative Examples and Reference Examples is shown in Tables 5 to 8. Also reported are the average sheet resistance of a p-type diffusion layer formed in the substrate by using these coating fluids, coating and heat treating under the same conditions and the CV value (=standard deviation/average sheet resistance) which is an index of in-plane variation. Note that the average sheet resistance is calculated from measurements over the substrate surface at a spacing of 5 mm. The current and voltage properties (Voc, Jsc, FF, Efficiency) of the solar cells fabricated using the coating fluids of Examples, Comparative Examples and Reference Examples are also shown in Tables 5 to 8. The measurement value is an average of ten samples in each example.

TABLE 5

|  | Example | | Reference Example |
|---|---|---|---|
|  | 1 | 2 | 1 |
| Coating fluid viscosity (mPa − s) | 107 | 112 | 113 |
| Average sheet resistance of p-type diffusion layer (Ω/□) | 44.0 | 44.1 | 46.7 |
| CV (%) | 4.7 | 6.5 | 10.8 |
| Voc (mV) | 647 | 645 | 640 |
| Jsc (mA/cm$^2$) | 37.7 | 37.6 | 37.2 |
| FF (%) | 80.2 | 79.8 | 78.7 |
| Efficiency (%) | 19.6 | 19.4 | 18.7 |

TABLE 6

|  | Comparative Example | Example | | Reference Example |
|---|---|---|---|---|
|  | 1 | 1 | 3 | 2 |
| Coating fluid viscosity (mPa − s) | 59 | 107 | 133 | 155 |
| Average sheet resistance of p-type diffusion layer (Ω/□) | 48.7 | 44.0 | 45.3 | 47.3 |
| CV (%) | 12.5 | 4.7 | 6.1 | 8.5 |
| Voc (mV) | 638 | 647 | 646 | 641 |
| Jsc (mA/cm$^2$) | 36.5 | 37.7 | 37.6 | 37.3 |
| FF (%) | 77.9 | 80.2 | 80.0 | 78.8 |
| Efficiency (%) | 18.1 | 19.6 | 19.4 | 18.8 |

TABLE 7

|  | Comparative Example | Example | | Reference Example |
|---|---|---|---|---|
|  | 2 | 1 | 4 | 3 |
| Coating fluid viscosity (mPa − s) | 77 | 107 | 129 | 141 |
| Average sheet resistance of p-type diffusion layer (Ω/□) | 50.2 | 44.0 | 44.2 | 45.4 |
| CV (%) | 10.9 | 4.7 | 5.5 | 8.9 |
| Voc (mV) | 638 | 647 | 645 | 643 |
| Jsc (mA/cm$^2$) | 36.9 | 37.7 | 37.8 | 37.5 |
| FF (%) | 78.1 | 80.2 | 80.1 | 78.6 |
| Efficiency (%) | 18.4 | 19.6 | 19.5 | 19.0 |

TABLE 8

| | Comparative Example 3 | Example 1 | Example 5 | Reference Example 4 |
|---|---|---|---|---|
| Coating fluid viscosity (mPa·s) | 109 | 107 | 109 | 104 |
| Average sheet resistance of p-type diffusion layer (Ω/□) | 52.8 | 44.0 | 45.0 | 49.2 |
| CV (%) | 13.2 | 4.7 | 7.7 | 10.6 |
| Voc (mV) | 637 | 647 | 647 | 642 |
| Jsc (mA/cm$^2$) | 37.0 | 37.7 | 37.5 | 37.3 |
| FF (%) | 78.5 | 80.2 | 80.1 | 78.6 |
| Efficiency (%) | 18.5 | 19.6 | 19.4 | 18.8 |

The solar cells of Examples all display an efficiency in excess of 19%, indicating a photoelectric conversion efficiency surpassing the electrical performance of the cells of Comparative Examples.

Comparative Examples 1, 2 and 3 lack one of organic binder, silica and alumina precursor, which causes a degradation of solar cell performance. An increase of CV value results in a p-type diffusion layer losing in-plane uniformity, inviting a lowering of FF.

In Reference Examples 1 to 4 having an excess content of any one ingredient, the solar cell performance is somewhat inferior as compared with Examples. Since the solid ingredient contained in excess in the coating fluid agglomerates, a p-type diffusion layer formed loses in-plane uniformity.

The composition of the boron diffusion coating fluid of the invention provides for a sufficient supply of p-type impurity and a dense alumina film's effect of preventing outward diffusion of p-type impurity, and ensures that a p-type diffusion layer having in-plane uniformity is formed. This leads to improvements in electric properties of solar cells and eventually allows competitive solar cell products to be manufactured.

The invention is not limited to the foregoing embodiments. The embodiments of the composition, application and heat treatment of the coating fluid are merely exemplary. The invention include all embodiments having substantially the same construction and exerting similar effects as the technical concept of the invention.

Japanese Patent Application No. 2011-220051 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of fabricating a semiconductor device comprising:
    using a coating fluid for boron diffusion into a silicon substrate to form a p-type diffusion layer,
    wherein, the coating fluid comprises a boron compound, an organic binder, a silicon compound, water and/or an organic solvent and an alumina precursor which includes aluminum hydroxide, aluminum chloride or aluminum chloride hexahydrate that forms an alumina film upon heat treatment for boron diffusion,
    wherein the alumina film inhibits outward diffusion of boron and enhances retention thereof during the heat treatment.

2. The method of claim 1 wherein the semiconductor device is a solar cell.

3. The method of claim 2, comprising the steps of:
    providing a n-type silicon substrate with a texture,
    applying the coating fluid of one surface of the silicon substrate,
    causing a p-type diffusion layer to form,
    forming a n-type diffusion layer on another surface of the silicon substrate,
    forming an antireflective coating on each of the diffusion layers, and
    forming electrodes.

* * * * *